(12) United States Patent
Chen et al.

(10) Patent No.: US 6,473,361 B1
(45) Date of Patent: Oct. 29, 2002

(54) ELECTROMECHANICAL MEMORY CELL

(75) Inventors: Jingkuang Chen, Rochester, NY (US); Feixia Pan, Rochester, NY (US); Joel A. Kubby, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/709,096

(22) Filed: Nov. 10, 2000

(51) Int. Cl.[7] .................................................. G11C 8/00
(52) U.S. Cl. ...................... 365/244; 365/151; 365/164
(58) Field of Search ................................ 365/244, 151, 365/164

(56) References Cited

U.S. PATENT DOCUMENTS

| | | | |
|---|---|---|---|
| 4,979,149 A | | 12/1990 | Popovic et al. |
| 5,036,490 A | | 7/1991 | Kajimura et al. |
| 5,053,995 A | * | 10/1991 | Kajimura et al. ............ 365/151 |
| 5,262,000 A | | 11/1993 | Welbourne et al. |
| 5,638,946 A | | 6/1997 | Zavracky |
| 5,793,040 A | * | 8/1998 | Oguchi et al. ............... 250/306 |
| 5,796,152 A | | 8/1998 | Carr et al. |
| 5,886,922 A | * | 3/1999 | Saito et al. .................. 365/164 |
| 5,966,066 A | * | 10/1999 | Mehregany et al. .......... 337/70 |
| 6,054,745 A | | 4/2000 | Nakos et al. |
| 6,100,109 A | | 8/2000 | Melzner et al. |

* cited by examiner

Primary Examiner—Hoai Ho
Assistant Examiner—Connie C. Yoha
(74) Attorney, Agent, or Firm—Fay, Sharpe, Fagan, Minnich & McKee, LLP

(57) ABSTRACT

A low power, nonvolatile microelectromechanical memory cell stores data. This memory cell uses a pair of cantilevers, to store a bit of information. The on and off state of this mechanical latch is switched by using, for example, electrostatic forces applied sequentially on the two cantilevers. The cantilevers are partially overlapping. Changing the relative position of the cantilevers determines whether they are electrically conducting or not. One state represents a logical "1". The other state represents a logical "0". After a bit of data is written, the cantilevers are locked by mechanical forces inherent in the cantilevers and will not change state unless a sequential electrical writing signal is applied. The sequential nature of the required writing signal makes inadvertent or noise related data corruption highly unlikely. This MEMS memory cell can be implemented, for example, using a three-polysilicon-layer surface micro-machining process. The mechanical nature of the memory cell makes the cell immune to radiation. The cell is compatible with existing VLSI processes. Therefore monolithic memory devices comprising, for example, a plurality of the memory cells, read/write circuitry, and I/O circuitry, can be made using inexpensive, standard processes. The memory devices can be used in almost any electronic device requiring memory. For example the memory device is used in document processors, cell phones and satellites.

13 Claims, 15 Drawing Sheets

ELECTROMECHANICAL MEMORY CELL

FIELD OF THE INVENTION

The invention relates to the art of non-volatile electronic memory. It finds particular application where low power consumption, and/or low writing voltage requirements are advantageous. Furthermore, the invention finds application where stored data must not be affected by radiation.

DESCRIPTION OF RELATED ART

Memory devices play an important role in modern microelectronic systems. For example, memory devices store instruction sets, programs, and/or data for computer processors. Electronic systems use memory devices for example, when performing calculations, signal processing, or data analysis. There are many different memory architectures used for storing information. For example, some moving surface memories store data in the form of magnetic dipoles. Magnetic tapes and discs are examples of these kinds of memory devices. Compact disks store information by varying optical characteristics of points on the surface of the disk. Semiconductor memories typically hold information in the form of charges or electrical potentials in transistor circuits. Transistor based memory devices are inexpensive, relatively small and are compatible with an on-chip addressing circuitry. Therefore, semiconductor memories made of transistors have become the most popular devices for data storage in systems that require a high read/write speed and a compact device size. Nowadays, semiconductor memories find broad applications in areas, which range from computer systems to telecommunications, commercial and military avionics systems, consumer electronics, and advanced weapon systems. In these applications, it is expected that the memories can be accessed at a high speed, exhibit low power consumption, and can be operated at a low driving voltage. Furthermore, these memories must be immune to environmental disturbances, for example, radiation and mechanical shock. While semiconductor memories have achieved many of these goals, their performance is not ideal in some respects. For example, the energy efficiency of some read/write memories is relatively poor, and most transistor memories are sensitive to radiation.

Semiconductor memories are characterized as read-only memory (ROM) and random access memory (RAM). ROM is programmed once, for example, when a machine is being manufactured at a factory or when the ROM itself is being manufactured. From that point onward, data can only be read out of a ROM device. In RAM, data is both written to and read from the device as the requirements of an application dictate. RAM can either be static mode (SRAM) or dynamic mode (DRAM) devices. In SRAM, information is stored, for example by setting up the logic state of a bistable flip-flop. In DRAM, data is stored through the charging of a capacitor. Typically, the information stored in these RAMs is lost if the supply power is turned off. Therefore, these memories devices are called volatile memories. There are memory devices that retain information even after power is removed from them. These devices are known as nonvolatile memories. Nonvolatile memories store information either in a transistor matrix that is connected according to a prescribed mapping relation or in floating gates of MOS transistors. In the latter case, the information stored in a memory cell can be changed by applying an ultraviolet light or an electrical signal to remove charge from or add charge to the floating gate. The floating gate MOS memories in which the contents of the cells can be altered through the use of an electrical signal are called flash memories.

Flash memories are capable of retaining information with the supply power off. Therefore flash memory is widely applied in applications that require low power consumption. Digital cameras, wireless communication apparatuses, computers, as well as many portable electronic systems all use flash memories as their major data storage apparatus. While flash memories have many advantages as nonvolatile memories, their energy efficiency is relatively poor during the programming process. Flash memories write data by injecting charges into floating gates, which are surrounded by dielectric layers used to keep the charges from leaking away. While these dielectric layers are effective in blocking charges from escaping, they also form a high barrier that shields charges from being injected into the floating gate during a data writing process. In the writing/erasing process of flash memories, charges have to penetrate through the dielectrics either by hot carrier injection or by a quantum mechanical conduction process called Fowler-Nordheim tunneling. These injection/tunneling processes generally require a high electric field to help carriers overcome the potential barrier of the shielding dielectrics. The dielectrics are insulators. Therefore, the efficiency of these injection/tunneling processes is poor. For example, in the currently available flash memory technology, the thickness of the dielectrics is in the order of tens of an angstrom. The percentage of charges that can penetrate through these thick dielectrics, to reach the floating gate, is generally lower than 1%. The low efficiency, and the requirement of a high supply voltage, limits the usefulness of flash memories, especially in applications that require a low supply voltage and low power consumption.

In addition to energy efficiency, one of the major drawbacks of semiconductor memories is that they are sensitive to radiation. Traditional semiconductor memories store information in the form of charges or electrical potentials in transistors. These charges and electrical potentials are very sensitive to radiation. In order to prevent the contents of semiconductor memories from being damaged by radiation, special protection layers or device structures need to be applied. However, these approaches typically require more complicated fabrication processes or packaging that introduce a higher cost. The development of a simple, radiation-hard memory is therefore important for many applications. For example aircraft, spacecraft, medical equipment and equipment that, as a side effect of operation, generates radiation all require or can benefit from the use of radiation-hard memory devices.

BRIEF SUMMARY OF THE INVENTION

In order to address the above-described issues, a low power, nonvolatile Microelectromechanical (MEMs) memory cell operative to store data has been developed. This memory cell comprises a first cantilever including a conductive portion, and a second cantilever having an insulated portion and a conductive portion, the second cantilever positioned, at least in part, in overlapping relation to the first cantilever.

A writing process of the memory cell includes a sequential moving or bending and releasing of the cantilevers to place them in a selected orientation. For example, where the first cantilever starts out as an upper cantilever and the second cantilever starts out as a lower cantilever, the writing process comprises moving, bending or flexing the second cantilever out of a movement or bending path of the first cantilever, moving, bending or flexing the first cantilever out of a returning path of the second cantilever, releasing the second cantilever, thereby allowing the second cantilever to follow the returning path of the second cantilever, releasing the first cantilever, thereby allowing the first cantilever to follow a return path of the first cantilever, whereby the first cantilever becomes a lower cantilever and the second cantilever becomes an upper cantilever.

Data or information is encoded in the selected orientation.

The memory cell is used in memory devices. For example, a memory device based on the memory cell comprises a plurality of memory cells, each memory cell comprising a first cantilever, a second cantilever and a cantilever actuator, and a control circuit operative to drive the cantilever actuators to sequentially move or bend and release the first and second cantilevers so as to place the first and second cantilevers in one of a first overlapping relation, and a second overlapping relation.

The memory device is used to make electronic devices. For example, an electronic device that takes advantage of the memory cell comprises at least one memory device, the at least one memory device comprising a plurality of memory cells, each memory cell comprising a first cantilever, a second cantilever and a cantilever actuator. Additionally, the electronic device comprises computational hardware operative to, at least one of, read data from and write data to, the at least one memory device, and an output device operative to present a work product of the computational hardware. For example, the output device can be a xerographic print engine.

One advantage of the present invention resides in the energy efficiency of the writing process of the memory cell. For example, moving or bending the cantilevers can be accomplished through the use of electrostatic force. Therefore, writing can be accomplished by charging and discharging a pair of movable capacitors. The energy efficiency of such a process is much higher than that of, for example, a flash memory.

Another advantage of the present invention is found in the radiation immunity of the memory cell. Data is stored in the physical positions of the cantilevers. The physical positions of the cantilevers are unaffected by radiation.

Yet another advantage of the present invention is that the memory cell can be manufactured in a simple fabrication process that results in a lower device cost. For example, Multi-polysilicon MEMs structures are easier to fabricate than EEPROM (Electrically Erasable & Programmable Random Access Memory) cells, which require very delicate floating gate structures.

Still other advantages of the present invention will become apparent to those skilled in the art upon a reading and understanding of the detail description below.

BRIEF DESCRIPTION OF THE SEVERAL VIEWS OF THE DRAWINGS

The invention may take form in various components and arrangements of components, and in various steps and arrangements of steps. The drawings are only for purposes of illustrating preferred embodiments, they are not to scale, and are not to be construed as limiting the invention.

DETAILED DESCRIPTION OF THE INVENTION

A nonvolatile memory device that overcomes the high supply voltage, writing efficiency, and radiation susceptibility limitations of flash memory is implemented using Microelectromechanical Systems (MEMS) technology. MEMS technology is used to create a pair of cantilevers that are used as a memory cell. The memory cell is simple to both use and manufacture. For example, the memory cell can be implemented using a MEMS technology that allows for CMOS addressing circuitry to be integrated on the same chip. Therefore, the whole memory system can be fabricated at a low cost. The latch can be switched between on and off states using for example, electrostatic or magnetic forces or thermal bending. Data stored in the memory is read out as, for example, a capacitance or a resistance measurement.

For example, the memory cell comprises a pair of polysilicon cantilevers. The on and off state of this mechanical latch is switched by using electrostatic forces applied sequentially on the two cantilevers. The relative position of the cantilever pair creates either a low resistance path or a high resistance path. Encoded in the resistance level is a bit of information, representing either a "1" or a "0⇋" state. Alternatively, a capacitance of the cantilever pair is effected by the relative positions of the cantilevers and data is read as either a relatively high or low capacitance. After a bit of data is written, the latch is locked by a mechanical force and will not change its state unless another electrical writing signal is applied.

Figure 1:
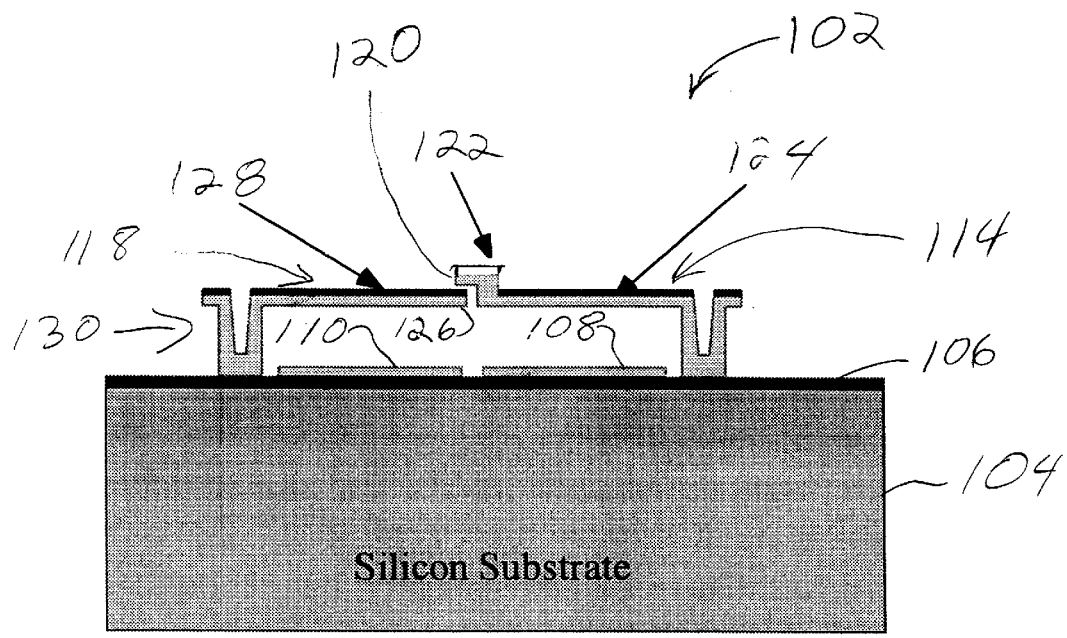
FIGS. 1–5 are cross sectional views of a first microelectromechanical memory cell showing various stages of a data writing process.

For example, referring to FIG. 1, a MEMS memory cell 102 includes a support substrate 104, a substrate insulation layer 106, a first gate or electrode 108, a second gate or electrode 110, a first cantilever 114 and a second cantilever 118. For example, the substrate 104 is made of silicon. The substrate-insulating layer 106 is made of silicon nitride. The first 108 and second 110 gates are made of highly doped polysilicon and are connected (not shown) to control circuits (see FIG. 12). The first gate 108 is a component of a first electrostatic actuator that is operative to cause the first cantilever to flex, move or bend away from both a natural position of the first cantilever 114, and an overlapping relationship the first cantilever has with the second cantilever 118. Similarly, the second gate 110 is a component of a second electrostatic actuator that is operative to cause the second cantilever to flex, move or bend away from a natural position of the second cantilever 118 and the overlapping relationship. The first and second electrostatic actuators comprise a means for sequentially flexing and releasing the first and second cantilevers whereby the cantilevers are placed in one of two steady state positions. The first 114 and second 118 cantilevers and associated control circuits are also components of the electrostatic actuators. The control circuits comprise switching circuits operative to selectively connect the cantilevers and gates to predetermined voltage sources and reference points. The design and operation of the control circuits will be obvious to those of ordinary skill in the art upon reading and understanding the following description.

The first 114 and second 118 cantilevers include fixed ends that are anchored at respective positions relative to the substrate. The first 114 and second 118 cantilevers are made of highly doped polysilicon. Therefore, the first 108 and second 110 gates, and the first 114 and second 118 cantilevers are all made of conductive material. The first cantilever includes 114 a free end having a first tip 120. A first or upper surface of the first tip 120 is coated with a metal layer 122. A remaining first or upper surface portion of the first cantilever 114 is covered with an first insulating dielectric layer 124. For example, the first insulating dielectric is an artifact of a manufacturing process. The second cantilever 118 includes a free end having a second tip 126. A first or upper surface of the second cantilever 118, including a first or upper surface of the second tip 126, is coated with a second insulating dielectric layer 128. The dielectric layer 128 serves to insulate the second cantilever 118 from the first cantilever 114 when the second tip 126 is under the first tip 120.

In a first steady state 130, illustrated in FIG. 1, the first cantilever 114 overlaps the second cantilever 118. In the first steady state he first 114 and second 118 cantilevers are in a first natural state. In the first natural state, the cantilevers assume a first overlapping relation wherein the first tip 120 is above the second tip 126. Preferably, the tips 120, 126 of the cantilevers overlap each other by a length that is based on the minimum feature size of a fabrication technology used to manufacture the memory cell 102. Data is encoded and stored in the manner in which the cantilevers 114, 118 overlap. Since, as shown, the first cantilever 114 is above the second cantilever 118, the two cantilevers 114, 118 are separated by the second insulating dielectric layer 128 of the second cantilever 118. Therefore, the cantilevers 114, 118 are electrically insulated from each other. This condition represents a first binary state and is designated, for example, as "0".

Figure 2:
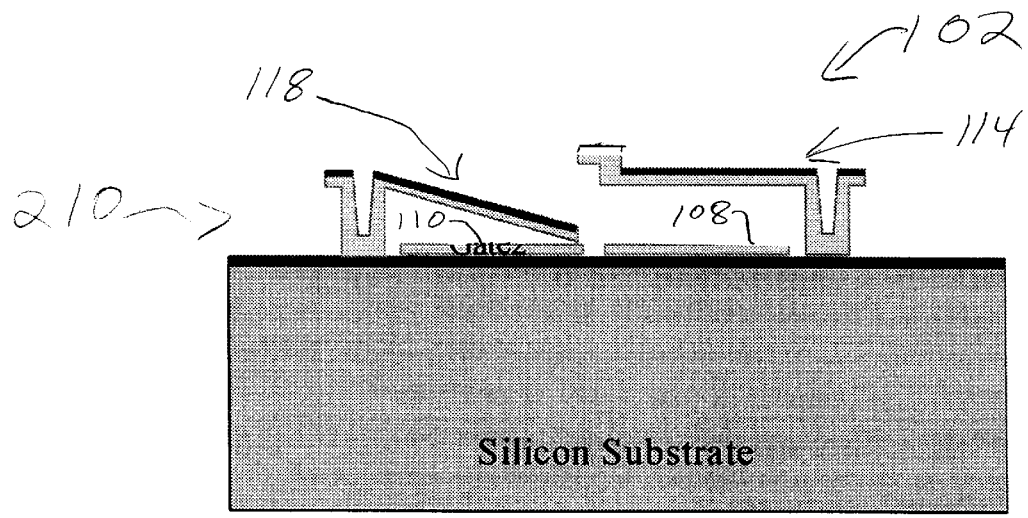
Figure 3:
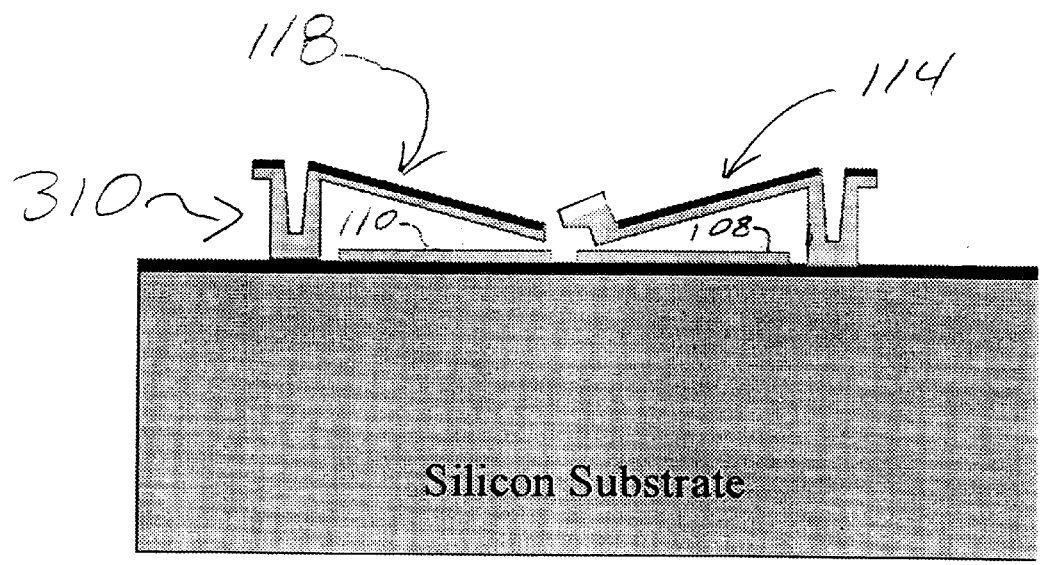
Figure 4:
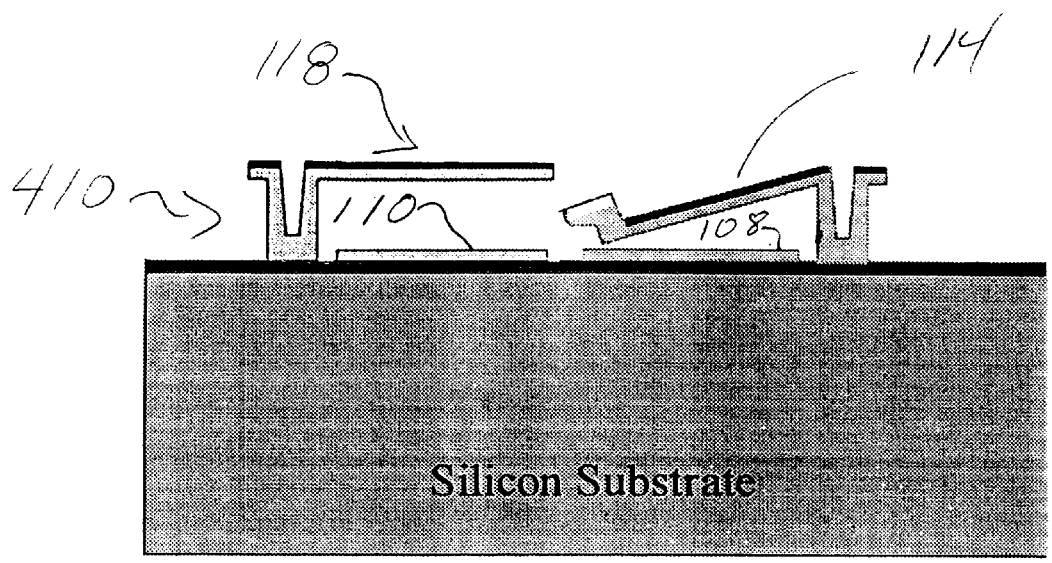

Steps in an exemplary data writing process are depicted in FIG. 2 through FIG. 4. The exemplary writing process changes the state of the memory cell 110 from representing the first binary state "0" to representing a second binary state designated, for example, as "1". In a first data writing step 210 the cantilevers 114, 118 are grounded through control circuits (See FIG. 12) and a voltage is applied on the second gate 110. Therefore, a charge related to the applied voltage is placed on the second gate 110. The charge generates an electrostatic attractive force between the second cantilever 118 and the gate. The second cantilever is flexed or bent toward the second gate 110 by the electrostatic force. Alternatively, the second cantilever includes a magnetic material, such as, for example, nickel and an electromagnetic coil is used to move, bend or flex the second cantilever. In another embodiment, one side of the second cantilever is heated, and the second cantilever moves or bends due to differential expansion.

Referring to FIG. 3, in a second data writing step 310, with the voltage applied on second gate 110 maintained, a second voltage is applied to the first gate 108. A charge related to the second voltage develops on the first gate 108. The charge on the first gate 108 generates attractive electrostatic forces relative to the first cantilever 114. Therefore, the first cantilever is flexed or bent toward the first gate 108. Alternatively, the first cantilever includes a magnetic material, such as, for example, nickel, and an electromagnetic coil is used to move, bend or flex the first cantilever. In another alternate embodiment, one side of the second cantilever is heated and the first cantilever moves or bends due to differential expansion.

Referring to FIG. 4, in a third data writing step 410, with the voltage applied on first gate 108 maintained, the voltage applied to the second gate 110 is returned to a neutral or ground state. The charge related to the first voltage is removed from the second gate 110 and the attractive force between the second gate 110 and the second cantilever 118 is dissipated. Therefore, mechanical restorative forces inherent in the second cantilever 118, return the second cantilever 118 to the natural position of the second cantilever.

Figure 5:
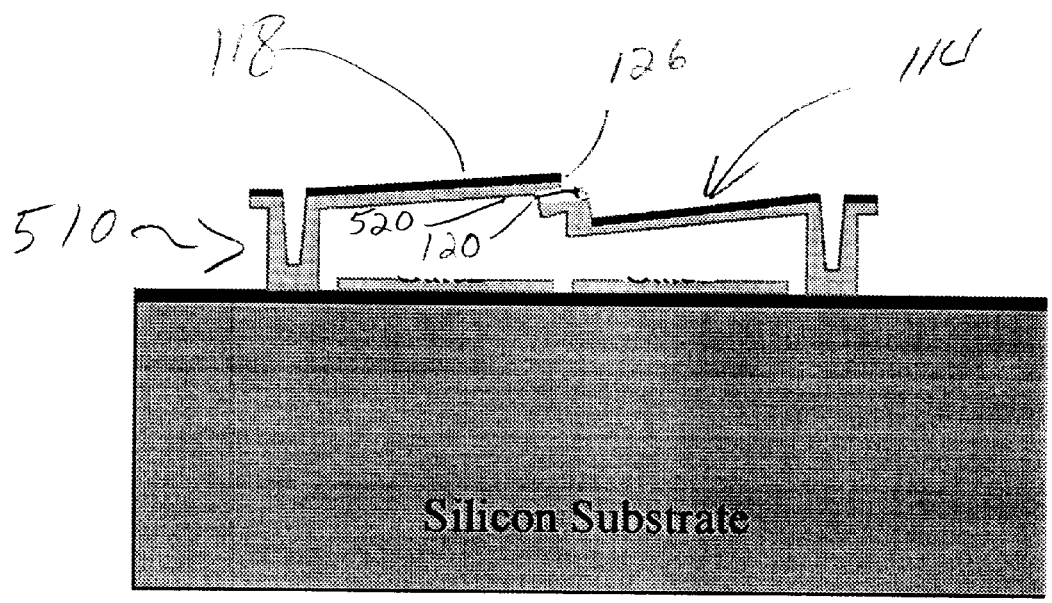

Similarly, referring to FIG. 5, in a fourth data writing step 510, the second voltage applied to the first gate 108 is returned to a neutral or ground state. The charge related to the second voltage is removed from the first gate 108 and the attractive force between the first gate 108 and the first cantilever 114 is dissipated. Restorative forces inherent in the first cantilever 114 return the first cantilever 114 toward the first cantilever's original natural position. However, due to the overlapping nature of the first 114 and second cantilevers 118, the first cantilever 114 is prevented from returning all the way back to the first cantilever's original position. Instead, the first tip 120 of the first cantilever 114 is caught underneath the second tip 126 of the second cantilever 118. This orientation is a second overlapping relationship of the first and second cantilevers 114, 118. In this position, the metal layer 122 of the first tip is in contact with a second or underside 520 of the second tip 126. The underside 520 of the second tip 126 is un-insulated. Therefore, the first cantilever 114 and the second cantilever 118 are electrically connected creating a low resistance path between the first cantilever and the second cantilever. This second steady state condition represents the second binary state and is designated, for example, as "1".

As will be obvious to those of ordinary skilled in the art, a writing operation operative to change a memory device 102 from the second or "1" steady state to the first or "0" steady state simply performs the above described steps in a reverse order. Once the cantilevers 114, 118 are in one of the steady states, the position of the cantilevers 114, 118 is locked. Spring tension, and like mechanical restraining forces, inherent in the structure of the cantilevers 114, 118, tend to maintain the position of the cantilevers 114, 118 and therefore tend to preserve the data represented by the position or orientation of the cantilevers 114, 118. Additionally, the series of movements 210, 310, 410 510, that must occur in order to change the state of the memory cell, serves to maintain the memory cell 102 in the state that it is in. For example, the relative position of the cantilevers 114, 118 will not change unless an appropriate series of electrical writing signals are applied to the cantilevers 114, 118 and gates 108, 110. As this is a sequential process, any mechanical vibration or shock may move both cantilevers 114, 118 at the same time, but is not likely to change their 114, 118 relative position or the state of the cell 102. Furthermore, while radiation may discharge the memory cell capacitors of a flash memory, radiation cannot effect the mechanical position of the cantilevers.

Variations on the described writing process are contemplated. For example, steps 410 and 510 may be combined.

Instead of being released after the second cantilever reaches the natural position of the second cantilever, the first cantilever may be released soon after the second cantilever is released.

This MEMS memory cell 102 can be implemented using a three-polysilicon-layer surface micromachining technology. Simulations show that with a 12 mm×10 mm cell size and a 2 mm cantilever-to-electrode separation, the driving voltage required to write data into the cell is 5.6 volts. A further reduction of the driving voltage is possible if the device is scaled down.

Figure 6:
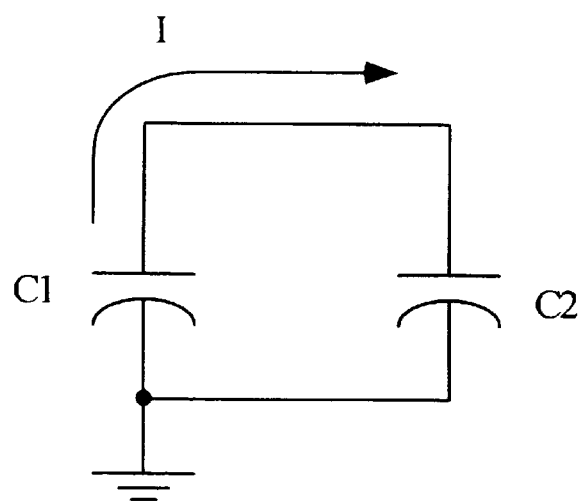
FIG. 6 is a schematic diagram illustrating a charge recycling aspect of memory cells such as the first microelectromechanical memory cell.

The writing process of this memory cell includes charging and discharging actions of a pair of movable micro capacitors (comprised of gate and cantilever pairs). Referring to FIG. 6, in a discharging process, the charges released by a first capacitor C1 can be used for charging a second capacitor C2. For example, the second capacitor C2 includes a cantilever and gate of a second cell. Therefore, charge used in the writing process can be recycled. The efficiency of the recycling process is defined as the ratio of recycled charge delivered from a first cell, for example C1, to the total amount of charge delivered to a second cell, for example C2. The efficiency depends, at least in part, on the value of interconnect resistance between cells. With currently available VLSI technology, which uses either aluminum or copper for device interconnection, the recycling efficiency of a memory device comprised of memory cells such the memory cell of FIG. 1, can approach 50%. This efficiency is much higher than the charge recycling efficiency of flash memories. In currently available flash memories charge recycling efficiency is typically lower than 0.1%.

Furthermore, the power required for writing a bit of data into the memory cell 102 of FIG. 1 is at least 10 times less than that required by traditional nonvolatile semiconductor memories, such as, for example, flash memories. The writing process of the MEMs memory cell 102, is an efficient charging process, involving the charging of a micro capacitor through a low resistance metal interconnect. The writing process of currently available flash technology memory, is a less efficient process requiring charge to pass through a thick, highly resistive, dielectric layer. This process involves quantum efficiency for charge delivery of less than 0.1%.

Figure 7:
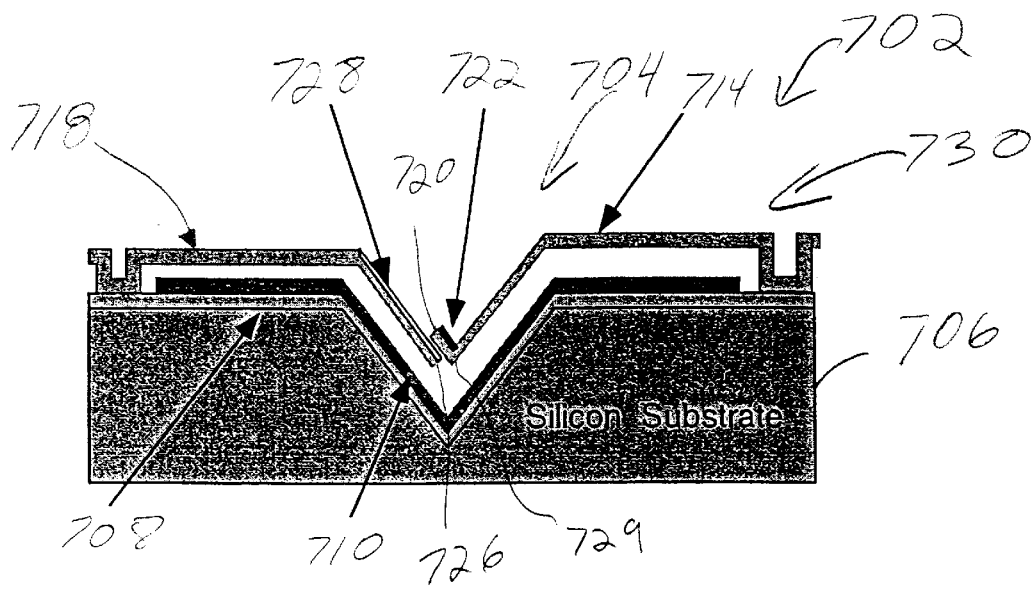
FIGS 7–11 are cross sectional views of a second microelectromechanical memory cell showing various stages of a data writing process.
Figure 8:
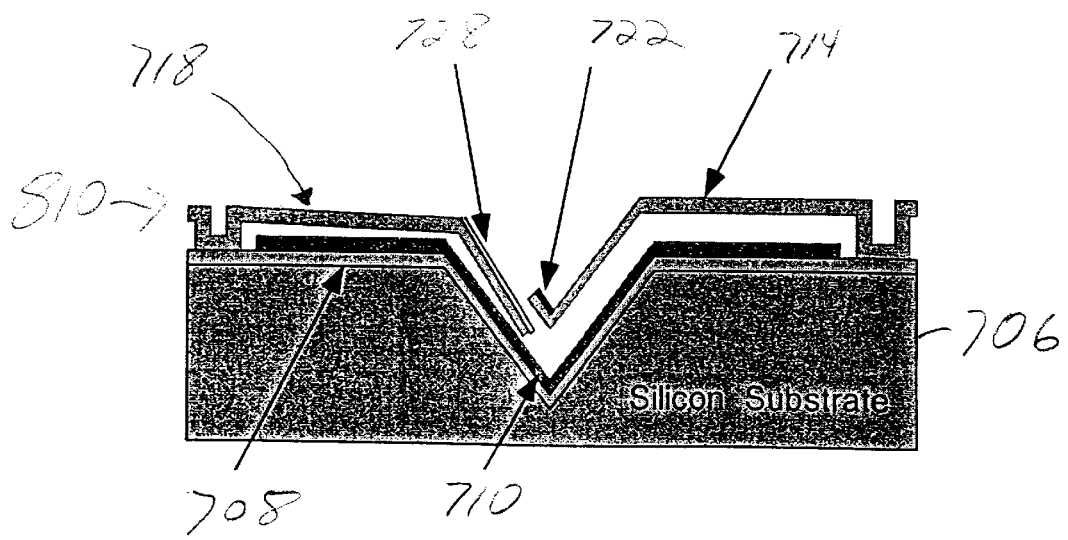

Referring to FIG. 7 a second MEMs memory cell 702 includes a V-shaped groove 704 etched into a substrate 706. As will be understood from the following description, the V-shaped groove provides for a cell geometry that allows a reduced writing voltage to actuate the required cantilever movements. The second MEMS memory cell 702 further includes an insulating dielectric layer 708, a single gate 710 or electrode, a first cantilever 714, and a second cantilever 718. The first 714 and second 718 cantilevers include fixed ends that are anchored at respective positions relative to the substrate. The first cantilever 714 has a free end including a first tip 720. The first tip includes an upper surface that is covered with a metal layer 722. The metal layer 722 is, for example, an alloy of chromium and gold. The second cantilever has a free end including a second tip 726. The second tip 726 includes an upper surface. The upper surface of the second tip 726 is covered with a tip insulating dielectric layer 728. The gate 710 and cantilevers 714, 718 are conductive. For example, the gate 710 and cantilevers 714, 718 are made of doped polysilicon. The gate 710 is positioned under both cantilevers and follows the contour of the V-shaped groove 704. As will be seen, the gate 710 is operative as an electrostatic reference, toward which attractive electrostatic forces act when at least one of the first cantilever and the second cantilever is electrically charged in relation to the gate. The cantilevers 714, 718 are suspended above the groove and are also generally shaped to follow the contour of the groove. Each cantilever 714, 718 includes a groove following portion that is substantially parallel to one leg of the V-shaped groove. The groove following portion of the first cantilever includes an angle or bend 729. The bend 729 gives the first tip 720 an "L" shape and places a lower or horizontal" leg of the "L" of the first tip 720, parallel to the second tip 726.

The substrate 710 is, for example, silicon. The use of silicon as a substrate limits the choice of groove angles. However, the crystalline structure of silicon allows for a groove angle of 70.6 degrees. This groove angle allows, for example, for a 19.4 degree difference between the direction of tip movement and the orientation of the tip overlap area. During a writing operation, the 19.4 degree difference allows the lower of the two cantilevers to move out of the way of the upper cantilever with only a small angular movement. This means that the cantilevers 714, 718 can be much closer to the substrate 706 and gate 710 than is the case in the first MEMs memory cell 102. Therefore, the groove 704 and the 19.4 degree difference allows for a cell geometry that provides a substantial reduction in writing voltage. Furthermore, the 19.4 degree difference allows for an increase in tip 722, 726 overlap tolerance. For example, with this geometry the gap between the cantilevers 714, 718 and the gate is reduced to about 1.0 um and the overlap between the tips can be as large as 0.9 um. These dimensions assume an approximate groove depth of 2 um. A 2 um groove depth is achievable within the current resolution limitations of photolithography on non-planar surfaces.

In a first steady state 730, illustrated in FIG. 7, the first cantilever 714 is above the second cantilever 718. As mentioned above, in this geometry, the tips can overlap by as much as 0.9 um. Data is encoded and stored in the manner in which the cantilevers 114, 118 overlap. Since the first cantilever 714 is above the second cantilever 718, the two cantilevers are separated by the second insulating dielectric layer 728 and are electrically insulated. This condition represents a first binary state and is designated, for example, as "0".

A process for writing data to the second MEMs memory cell 702 is very similar to the process for writing to the first memory cell 102. However, since the second memory cell 702 has only one large gate or plate 710 the gate is grounded and actuating voltages (or charges) are applied to the cantilevers 714, 718. Additionally, as stated earlier, geometry differences between the first 102 cell and the second 702 cell allow lower voltages to actuate the cantilevers 714, 718 of the second cell 702.

Steps in a second exemplary data writing process are depicted in FIG. 8 through FIG. 11. In a first data writing step 810 the gate 710 is grounded through a control circuit (see FIG. 12) and a voltage is applied to the second cantilever 718. A charge related to the voltage is placed on the second cantilever 718. The charge generates an electrostatic attractive force between the second cantilever 718 and the gate 710. Therefore, the second cantilever is bent toward the gate 710.

Figure 9:
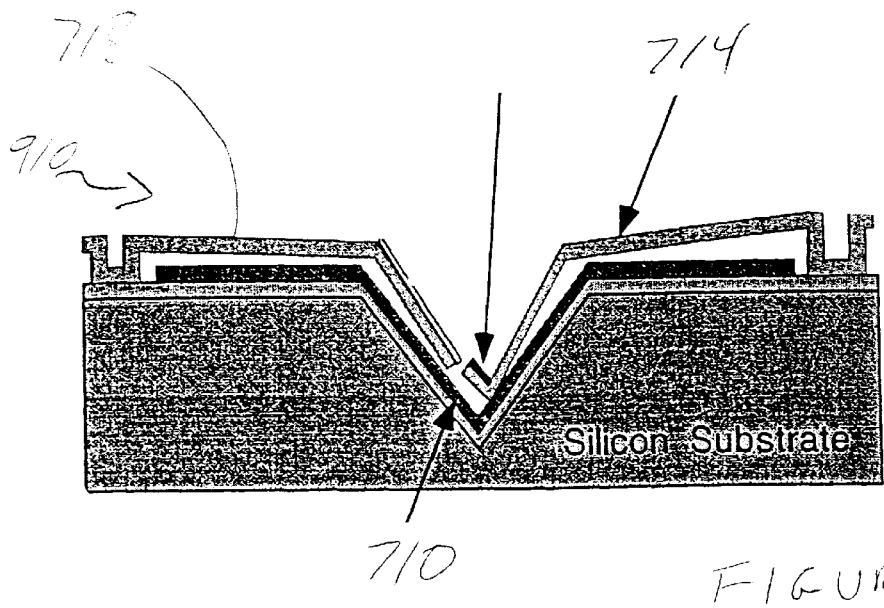

Referring to FIG. 9, in a second data writing step 910, with the voltage applied on second cantilever 718 maintained, a similar second voltage is applied to the first cantilever 714. A charge related to the second voltage develops on the first cantilever 714. The charge on the first cantilever 714 generates attractive electrostatic forces relative to the gate 710. Therefore, with the second cantilever 718 out of the way, the first cantilever is bent toward the gate 710.

Figure 10:
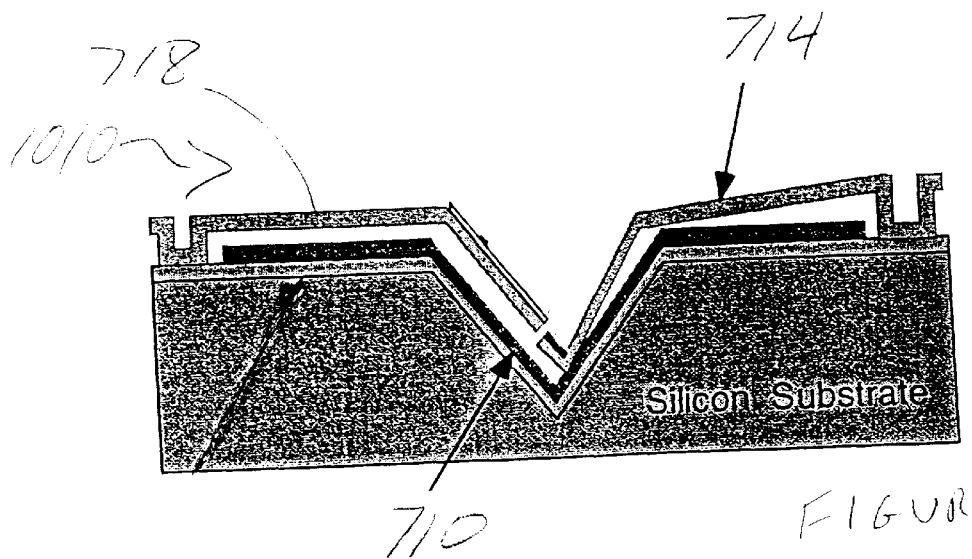

Referring to FIG. 10, in a third data writing step 1010, with the second voltage applied on first cantilever 714 maintained, the first voltage applied to the second cantilever 718 is returned to a neutral or ground state. Therefore, the charge related to the first voltage is removed from the second cantilever 718 and the attractive force between the second cantilever 718 and the second gate 710 dissipates. Therefore, mechanical restorative forces inherent in the second cantilever 718, return the second cantilever 718 to the second cantilever's original position.

Figure 11:
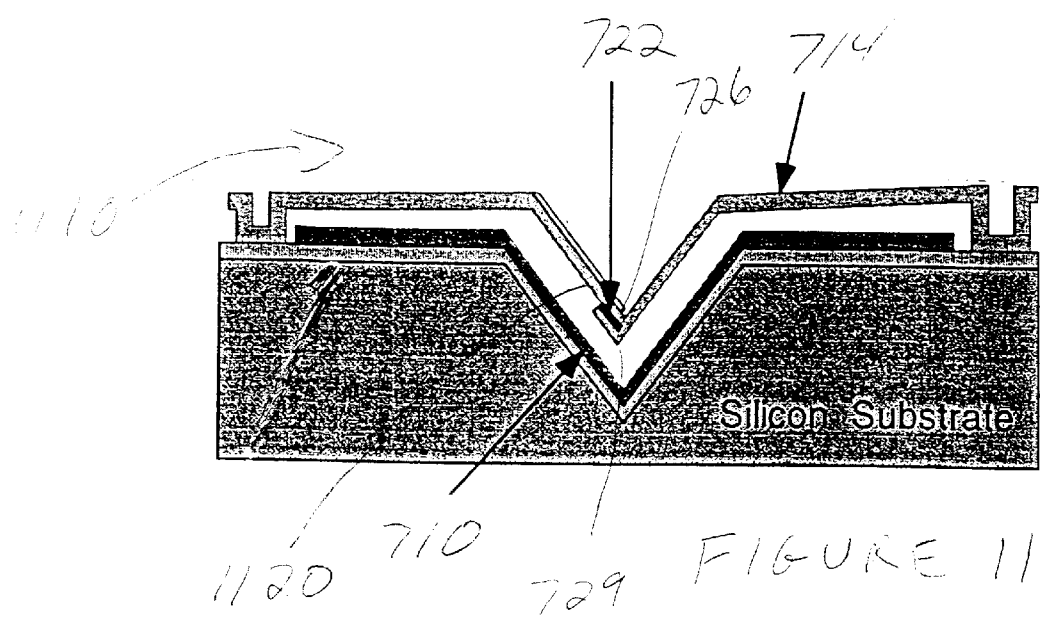

Similarly, referring to FIG. 11, in a fourth data writing step 1110, the second voltage applied to the first cantilever 714 is returned to a neutral or ground state. The charge related to the second voltage is removed from the first cantilever 714 and the attractive force between the first cantilever 714 and the gate 710 dissipates. Restorative forces inherent in the first cantilever 714, return the first cantilever 714 toward the first cantilever's original position. However, due to the overlapping nature of the first 714 and second cantilevers 118, and the angle or bend 729, the "L" shaped first tip 722 of the first cantilever 714 catches the underside of the second cantilever 718 an the first cantilever 714 is prevented from returning to the first cantilever's original position. Instead, the first tip 720 of the first cantilever 714 is caught underneath the second tip 726 of the second cantilever 718. In this position, the metal layer 722 of the first tip is in contact with a second or underside 1120 of the second tip 726. The underside of the second tip 726 is un-insulated. Therefore, the first cantilever 714 and the second cantilever 718 are electrically connected. This second steady state condition represents the second binary state and is designated, for example, as "1".

Figure 12:
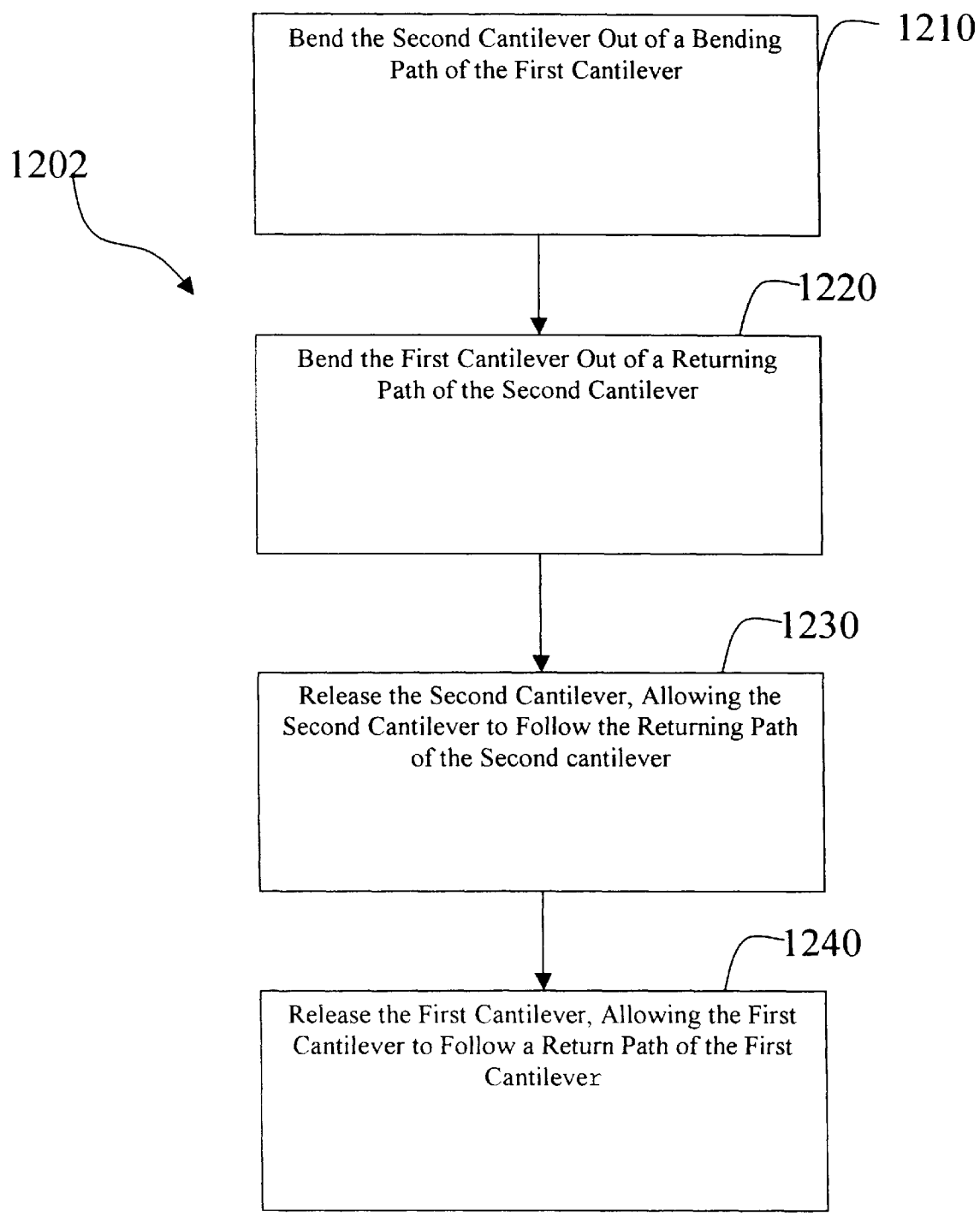
FIG. 12 is a flow chart summarizing a process of writing data to a memory cell such as the first and second microelectromechanical memory cells.

Referring to FIG. 12, in summary, a method 1202 for writing data to a MEMs memory cell, the memory cell comprising a first cantilever and a second cantilever, in an overlapping relationship with the first cantilever, and wherein the first cantilever starts out as an upper cantilever and the second cantilever starts out as a lower cantilever, begins with a second cantilever moving or bending step 1210. In the second cantilever moving or bending step 1210 the second cantilever is bent or flexed out of a moving or bending path of the first cantilever. Next, in a first cantilever moving or bending step 1220, the first cantilever is bent or flexed out of a returning path of the second cantilever. Subsequently, in a second cantilever releasing step 1230, the second cantilever is released, allowing the second cantilever to follow the returning path of the second cantilever toward an original position of the second cantilever. Finally, in a first cantilever-releasing step 1240 the first cantilever is released, allowing the first cantilever to follow a return path of the first cantilever. Due to this sequence of steps and the overlapping relationship of the first and second cantilevers the first cantilever becomes a lower cantilever and the second cantilever becomes an upper cantilever.

Figure 13:
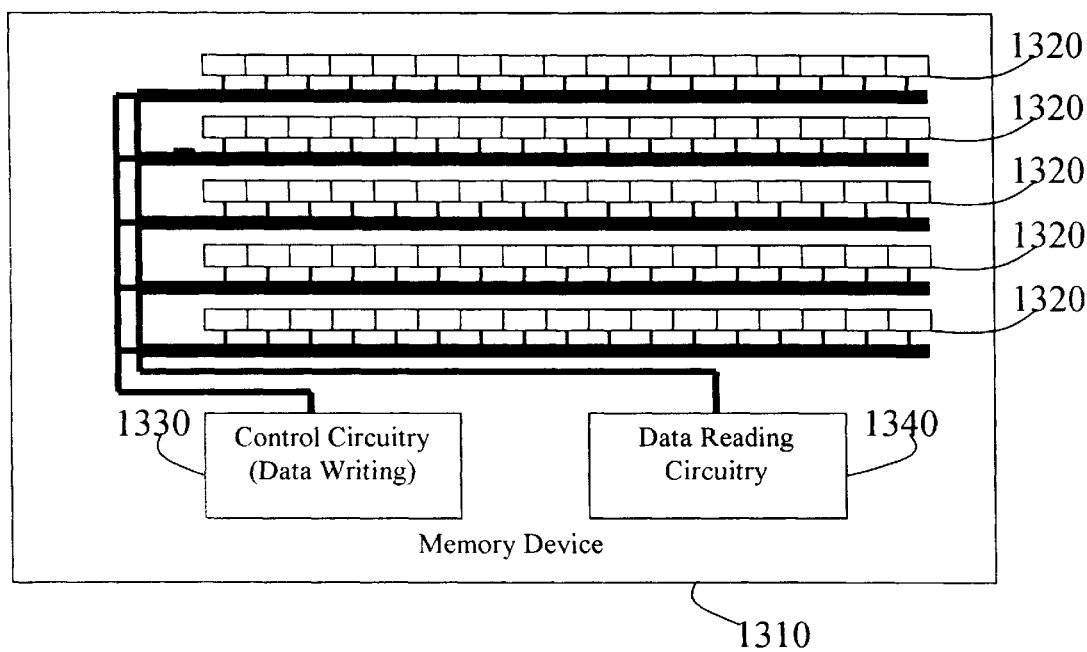
FIG. 13 is a block diagram of a memory device comprising a plurality of memory cells such as the first and second microelectromechanical memory cells.

Referring to FIG. 13, preferable MEMs memory cells are included in a memory device 1310. The memory device includes a plurality of MEMs memory cells 1320, such as, for example, the first 102 or second 702 memory cell. Additionally, the memory device includes control circuitry 1330 for sequentially applying voltages to gates and/or cantilevers for writing data to the cells. The control circuits comprise switching circuits that will be obvious to those of ordinary skill in the art. Optionally, the control circuitry includes charge recycling circuitry operative to store and re-use actuation charges. Additionally the memory devices include data reading circuitry 1340. For example, data reading circuitry 1340 measures the resistance between a first and a second cantilever. Resistance readings above a threshold value are reported as a first state. For example, if the resistance between cantilevers of a cell is above the threshold, the cell is reported to be in a "0" state. Furthermore, if the resistance between cantilevers of a cell is below the threshold, the cell is reported to be in a "1" state. Alternatively, the data reading circuit measures another property of the cantilever pair. For example, a first to second cantilever capacitance is measured and compared to a threshold to determine a cantilever or cell state.

Preferably, the first 102 and second 702 MEMs memory cells are manufactured by processes that are compatible with the manufacture of control and data reading circuits. For example, the first and second memory cells are manufactured by standard CMOS processes.

Figure 14A:
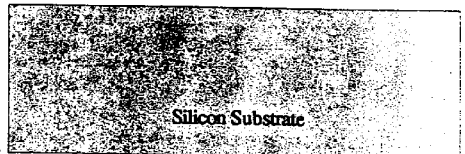
FIGS. 14a–14j are cross sectional views of various stages in a process for manufacturing the first microelectromechanical memory cell.
Figure 14B:
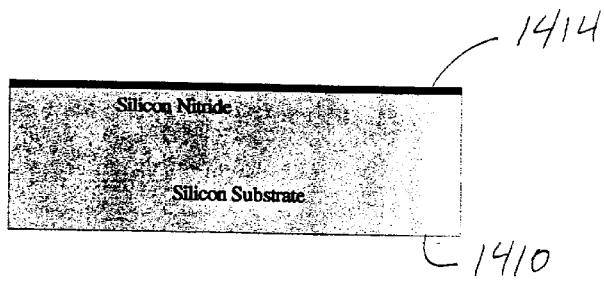
Figure 14C:
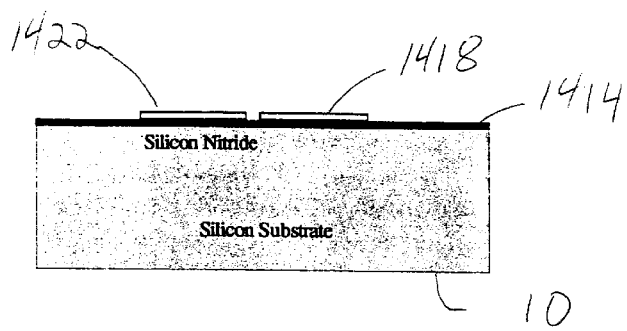
Figure 14D:
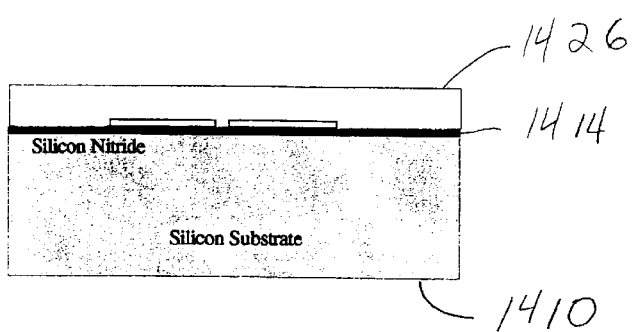
Figure 14E:
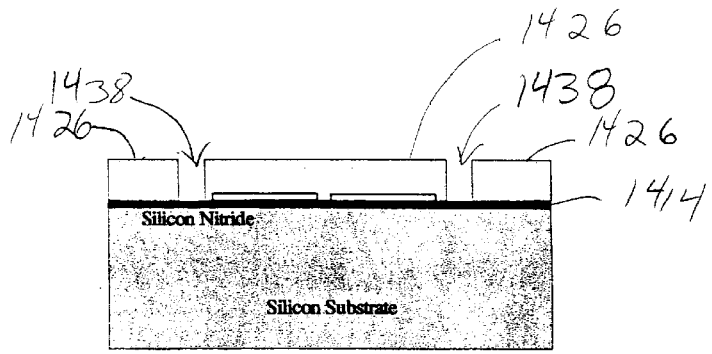
Figure 14F:
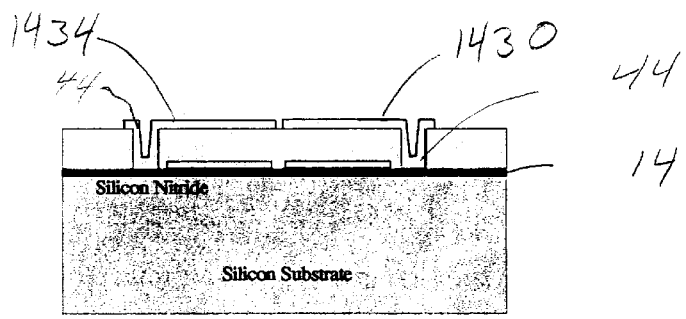
Figure 14G:
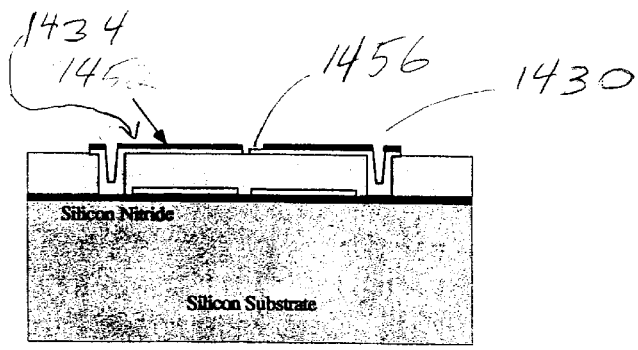
Figure 14H:
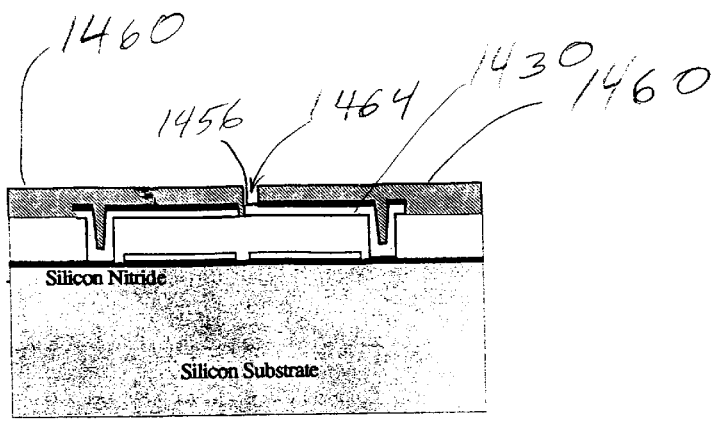
Figure 14I:
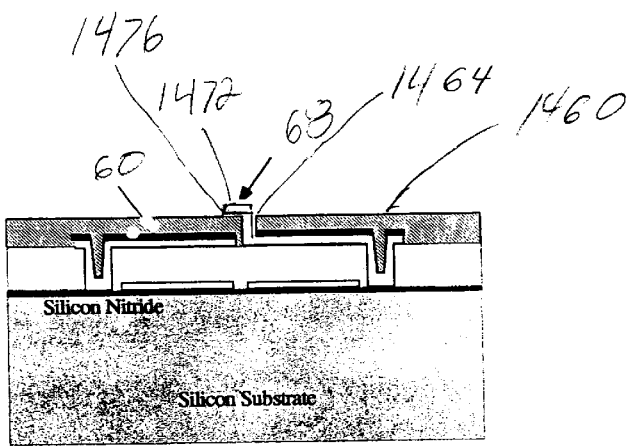
Figure 14J:
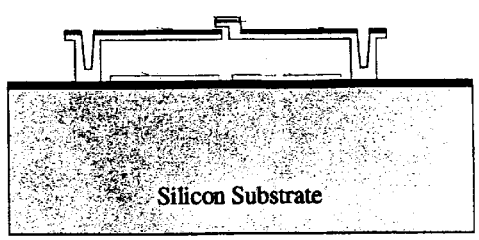

FIGS. 14a–14j outline a method for making the first memory cell 102. For example, the memory cell is part of a memory device 1310. Referring for FIG. 14a, the process starts with the selection of a substrate 1410. For example, the substrate 1410 is silicon. The doping of the silicon is not critical. Therefore the doping can be selected based on the needs of other components on the memory device 1310. Referring to FIG. 14b, an insulating dielectric 1414 is applied to the substrate 1410. For example, the dielectric 1414 is silicon nitride. Referring to FIG. 14c, a layer of highly doped polysilicon is deposited over the dielectric layer 1414. In a patterning process, the polysilicon is masked and etched to create first 1418 and second 1422 gates or electrodes. For example, photolithography and dry etching are used to create the gates 1418, 1422. Referring to FIG. 14d, a first layer of sacrificial oxide 1426 is deposited over the area of the cell. The thickness of the first layer of sacrificial oxide 1426 is related to a desired height of first 1430 and second 1434 cantilevers (see FIG. 14f). Referring to FIG. 14e, in a patterning step, anchoring holes 1438 are etched in the sacrificial oxide 1426. Referring to FIG. 14f, a second layer of highly doped polysilicon is deposited over the area of the cell. The polysilicon at least partially fills the anchoring holes 1438 and adheres to the silicon nitride layer 1414 at the bottom of the anchoring holes 1438. Furthermore, the second polysilicon layer is deposited on the sacrificial oxide 1426. In a patterning step the second polysilicon layer is masked and etched to create the first 1430 and second 1434 cantilevers. The polysilicon deposited in the anchoring holes 1438 forms supports and anchors 1444 for the cantilevers 1430, 1434. Referring to FIG. 14g, a dielectric layer is deposited over the area of the cell. For example, the dielectric is silicon nitride. Patterning leaves a first layer of dielectric 1448 over most of an upper surface of the first cantilever 1430 and a second layer of dielectric 1452 over an upper surface of the second cantilever 1434. During patterning, a tip 1456 portion of the first cantilever 1430 is etched to re-expose the polysilicon of the tip 1456. Referring to FIG. 14h, a second sacrificial oxide layer 1460 is deposited over the area of the cell. A patterning step creates a via 1464 over the exposed polysilicon of the tip 1456 of the first cantilever 1430. Referring to FIG. 14i, a third polysilicon layer is deposited over the area of the cell. The polysilicon fills the via 1464 and covers the surface of the second sacrificial oxide layer 1460. A thin metal layer is deposited and patterned to act as a mask. Metal 1468 is left covering polysilicon immediately above the via 1464 and a small portion 1472 of polysilicon adjacent the via 1464 and overlapping a portion of the second cantilever 1434. Exposed polysilicon is etched away leaving a metalized, offset tip 1476 on the first cantilever 1430. Finally, referring to FIG. 14j, wet etching is used to etch away the sacrificial oxide layers, leaving a memory cell 1480, such as, the first MEMs memory cell 102.

Figure 15A:
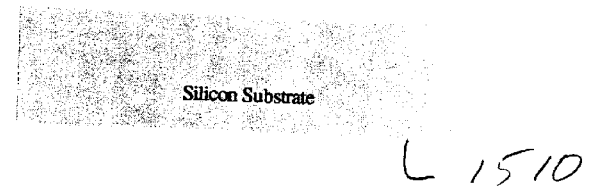
FIGS. 15a–15j are cross sectional views of various stages in a process for manufacturing the first microelectromechanical memory cell.
Figure 15B:
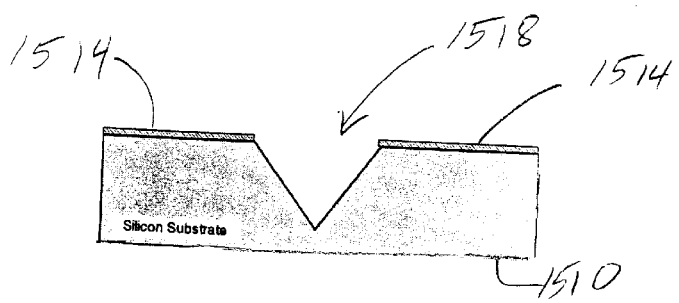
Figure 15C:
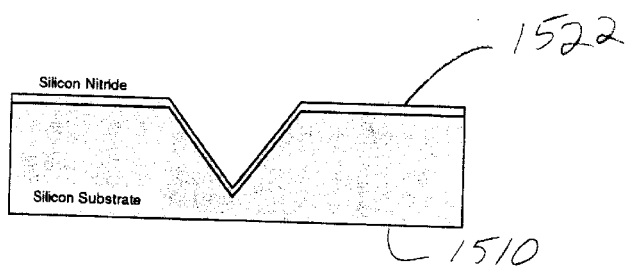
Figure 15D:
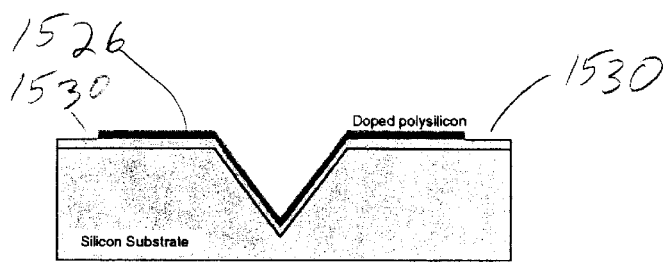
Figure 15E:
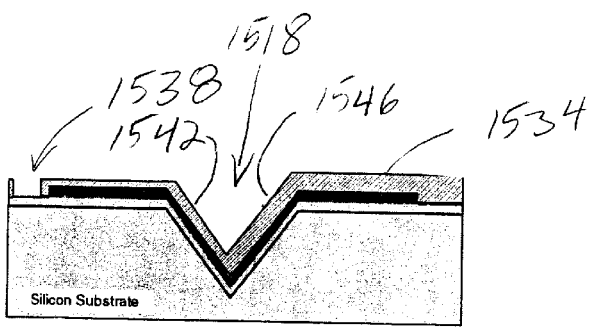
Figure 15F:
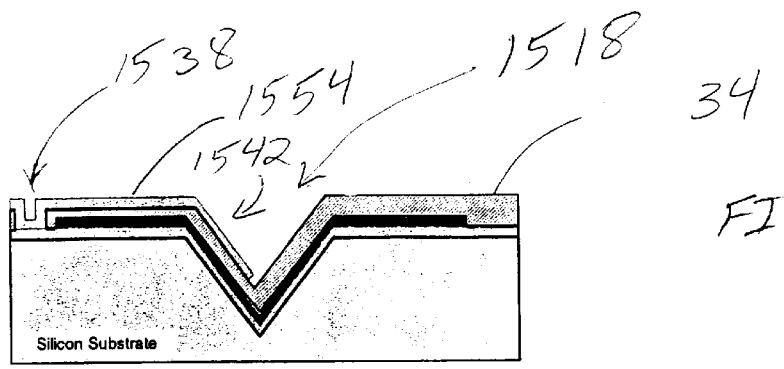
Figure 15G:
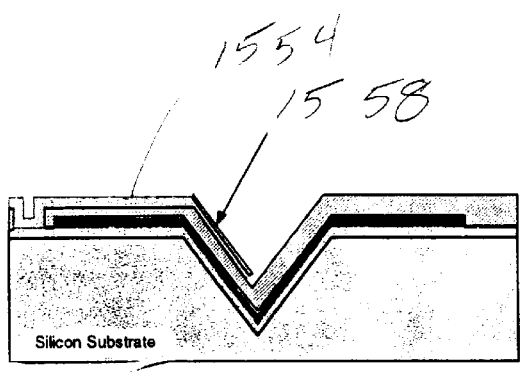
Figure 15H:
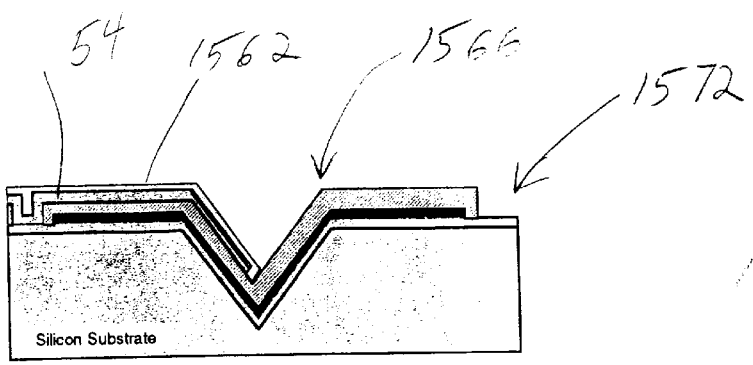
Figure 15I:
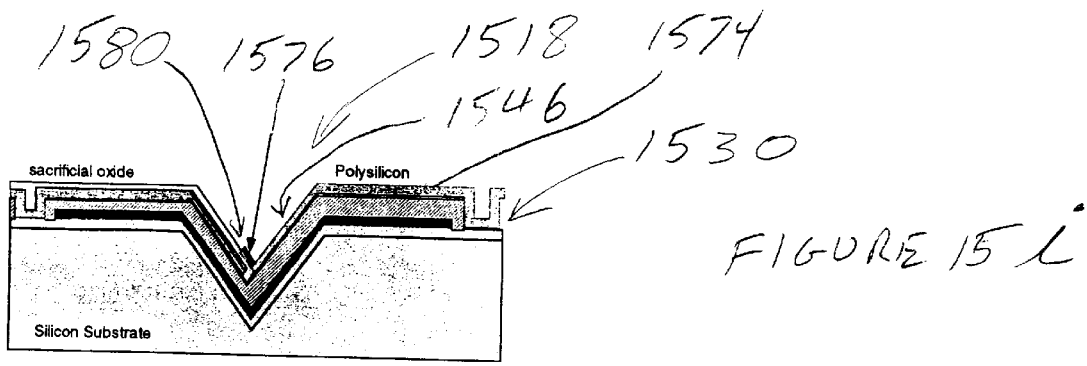
Figure 15J:
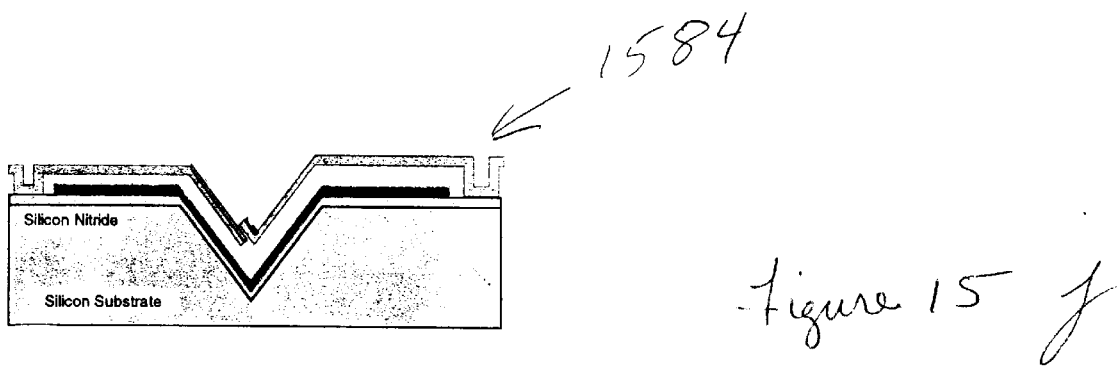
Figure 16:
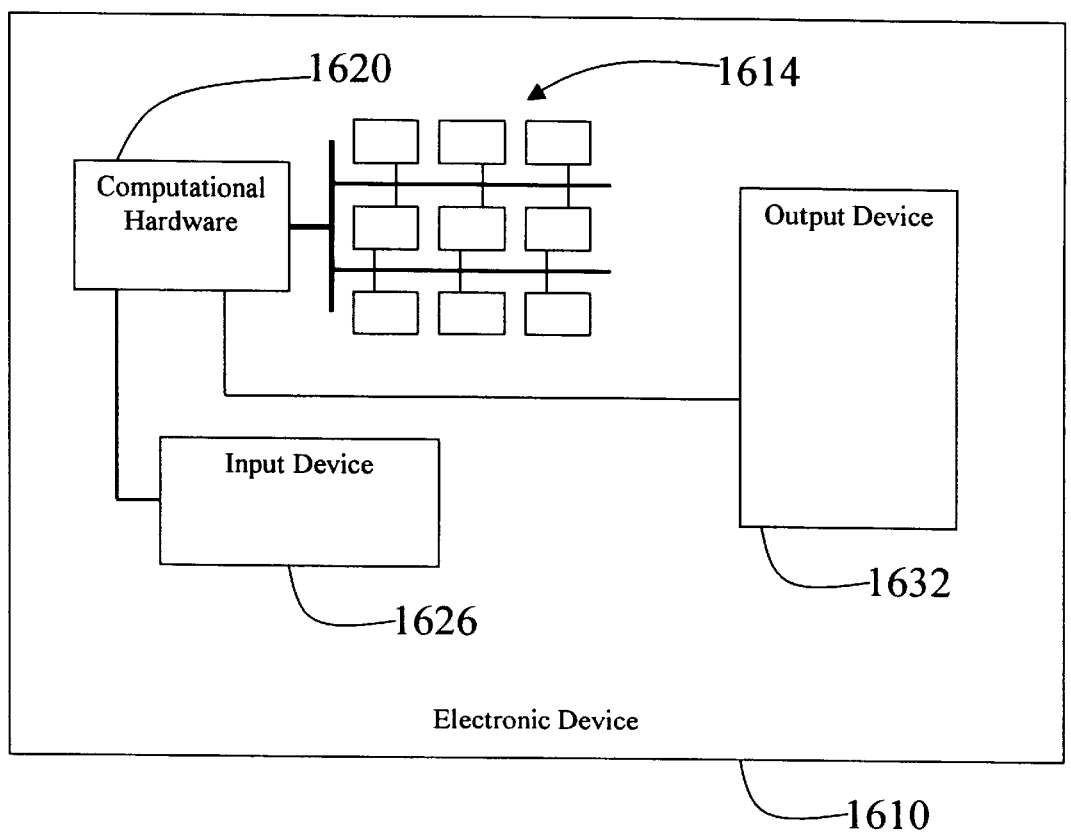
FIG. 16 is a block diagram of an electronic device comprised of at least one memory device of FIG. 13.

FIGS. 15a–15i outline a method for making the second memory cell 702. For example, the memory cell is part of a memory device 1310. Referring to FIG. 15a, again the process starts with the selection of a substrate 1510. Referring for FIG. 15b, An oxide layer 1514 is deposited on the substrate 1510 as a masking layer, and a V-shaped grove 1518 is etched into the substrate 1510. The substrate 1510 is, for example, a silicon substrate. Referring to FIG. 15c, the oxide is removed and a dielectric layer 1522 is deposited over the area of the cell. For example, the dielectric layer 1522 is silicon nitride. The dielectric layer 1522 isolates components of the memory cell from the substrate 1510. Referring to FIG. 15d, a first layer of polysilicon is deposited over the area of the cell. Then the polysilicon is patterned. The patterned polysilicon forms a large gate 1526 that fills the groove and extends beyond the edges of the groove toward points 1530 where cantilever anchors will be formed. Referring to FIG. 15e, a first sacrificial oxide layer 1534 is deposited over the area of the cell, and then patterned. The patterning provides a first anchor hole 1538 in the oxide 1534. Optionally, the patterning provides that the oxide layer over a first leg 1542 of the V-shaped groove 1518 is thinner than the oxide layer over a second leg 1546 of the V-shaped groove 1518. Alternatively, the thickness variation is provided later, by a second sacrificial oxide layer. Referring to FIG. 15f, a second polysilicon layer is deposited over the area of the cell, filling the first anchoring hole 1538, and covering the first sacrificial oxide layer 1534. The polysilicon is masked and etched. After etching the polysilicon forms a first cantilever 1554, anchored in the first anchor hole 1538, and extending into the V-groove 1518 substantially parallel to the first leg 1542 of the V-groove 1518. Referring to FIG. 15g, a thin layer of dielectric 1558, such as, for example, silicon nitride, is deposited over an upper surface of the first cantilever 1554. Referring to FIG. 15h, a second layer of sacrificial oxide 1562 is deposited and patterned to cover the first cantilever. Optionally (and not shown), the second sacrificial oxide layer 1562 thickens a portion 1566 of the first oxide layer that will support the second cantilever. For example, the second sacrificial oxide layer can coat and thereby add thickness to the first oxide layer over the second leg 1546 of the V-shaped groove 1518. Additionally, the first oxide layer is etched to create a second anchor hole 1572. Referring to FIG. 15i, a third polysilicon layer is deposited and etched to create the second cantilever 1574. The second cantilever 1574 is anchored in the second anchor hole 1572 and extends into the V-shaped groove 1518 substantially parallel to the second leg 1546 of the V-shaped groove 1518. A second tip 1576 of the second cantilever is formed at an angle to a portion of the second cantilever 1574 from which it extends. The angle causes the second tip to be substantially parallel to a first tip of the first cantilever 1580. Referring to FIG. 15j, wet etching is used to remove the sacrificial oxide layers, leaving a memory cell 1584 such as the first MEMs memory cell 702.

An electronic device 1610 includes at least one memory devices 1614 such as the memory device 1310 that comprises a plurality of MEMs memory cells 102, 702. For example, the device further includes computational hardware 1620, such as for example, a microprocessor, computer processor, digital signal processor, or micro-controller. The electronic device 1610 is, for example, a digital phone, laptop computer, document processor, radio, aircraft, spacecraft or satellite. The device may further include input 1626 and/or output 1632 components. For example, a phone includes a speaker, a microphone, and a keyboard. A laptop computer includes a keyboard and a display screen. In a document processor input devices 1626 include scanners, keyboards, and computer network adapters. The output devices of a document processor include a user display, such as, a CRT or liquid crystal display, computer network adapters and a print engine. For example the print engine is a xerographic printer or an ink jet printer. A radio includes a user display, a keyboard, and at least one speaker. A spacecraft includes many sensors, keyboards, displays screens and status indicators. A satellite includes sensors or transponders, and at least one radio transmitter. All of these devices may take advantage of the low power and low voltage requirements of the MEMs memory cells 102, 702 included in the memory devices 1614. For example, the aircraft, spacecraft and satellite take particular advantage of the low power requirement, and resistance to vibration and radiation of the MEMs memory cells 102, 702. The other devices take advantage of the low cost, low power requirement and low voltage requirement of the MEMs memory cells 102, 702.

The invention has been described with reference to particular embodiments. Modifications and alterations will occur to others upon reading and understanding this specification. For example, other cantilever geometries can be used. Where the cantilevers are shown one hundred and eighty degrees apart, other orientation angles can be used. For example, the cantilever tips may cross at forty-five or ninety degrees. Where a V-shaped groove is shown, grooves of other shapes can be substituted. For example, a rectangular trench is contemplated. Where electrostatic actuation is detailed, other kinds of actuators can be substituted. For example, electromagnetic and thermal actuator can be used. It is intended that all such modifications and alterations are included insofar as they come within the scope of the appended claims or equivalents thereof.

What is claimed is:

1. A memory cell operative to store data, the memory cell comprising:
    a first cantilever including a conductive portion;
    a second cantilever having and insulated portion and a conductive portion, the second cantilever positioned, at least in part, in overlapping relation to the first cantilever;
    a first actuator operative to selectively cause the first cantilever to move away from the overlapping relationship; and,
    a second actuator operative to selectively cause the second cantilever to move away from the overlapping relationship.

2. The memory cell of claim 1 wherein the first actuator is an electrostatic actuator.

3. The memory cell of claim 1 wherein the second actuator is an electrostatic actuator.

4. A memory cell operative to store data, the memory cell comprising:
    a substrate;
    a first cantilever having an anchored end fixed in position relative to the substrate, and a free end, the first cantilever having a first natural position; and
    a second cantilever having an anchored end fixed in position relative to the substrate, and a free end, the second cantilever having a second natural position, a portion of the second cantilever being in overlapping relation with the first cantilever when the first cantilever is in the first natural position and the second cantilever is in the second natural position;

a means for sequentially flexing and releasing the first and second cantilevers whereby the cantilevers are placed in one of two steady state orientations.

5. The memory cell of claim 4 wherein the substrate includes a V-shaped groove and wherein:

the first cantilever includes a first groove following portion that is substantially parallel to a first leg of the V-shaped groove; and the second cantilever includes a second groove following portion that is substantially parallel to a second leg of the V-shaped groove.

6. The memory cell of claim 4 wherein the means for sequentially flexing and releasing the first and second cantilevers comprises:

a gate operative as an electrostatic reference, toward which attractive electrostatic forces act, when at least one of the first cantilever and the second cantilever is electrically charged in relation to the gate.

7. The memory cell of claim 4 wherein the means for sequentially flexing and releasing the first and second cantilevers comprises:

a first gate operative to cause the first cantilever to bend away from the first natural position when the first gate is charged in reference to the first cantilever; and a second gate operative to cause the second cantilever to bend away from the second natural position when the second gate is charged in reference to the first cantilever.

8. A memory device comprising:

a plurality of memory cells, each memory cell comprising a first cantilever, a second cantilever and a cantilever actuator; and a control circuit operative to drive the cantilever actuators to sequentially bend and release the first and second cantilevers so as to place the first and second cantilevers in one of a first overlapping relation, and a second overlapping relation.

9. The memory device of claim 8 wherein the first overlapping relation provides for a relatively low resistance path from one cantilever to the other, and wherein the second overlapping relation provides for a relatively high resistance path from one cantilever to the other, the memory device further comprising:

a cell reading circuit operative to measure the resistance from one cantilever to the other and report the results of the measurement as one of two binary states.

10. An electronic device comprising:

at least one memory device, the at least one memory device comprising a plurality of memory cells, each memory cell comprising a first cantilever, a second cantilever and a cantilever actuator;

computational hardware operative to, at least one of, read data from and write data to, the at least one memory device; and an output device operative to present a work product of the computational hardware.

11. The electronic device of claim 10 wherein the output device comprises a print engine.

12. The electronic device of claim 10 wherein the output device comprises a xerographic print engine.

13. A method for writing data to a MEMs memory cell, the cell comprising a first cantilever and a second cantilever positioned in an overlapping relationship with the first cantilever wherein the first cantilever starts out as an upper cantilever and the second cantilever starts out as a lower cantilever, the method comprising:

bending the second cantilever out of a bending path of the first cantilever;

bending the first cantilever out of a returning path of the second cantilever;

releasing the second cantilever, allowing the second cantilever to follow the returning path of the second cantilever; and releasing the first cantilever, allowing the first cantilever to follow a return path of the first cantilever, whereby the first cantilever becomes a lower cantilever and the second cantilever becomes an upper cantilever.

* * * * *